(12) United States Patent
Sun et al.

(10) Patent No.: US 10,197,921 B2
(45) Date of Patent: Feb. 5, 2019

(54) EXPOSURE DEVICE

(71) Applicant: SHANGHAI MICRO ELECTRONICS EQUIPMENT (GROUP) CO., LTD., Shanghai (CN)

(72) Inventors: Jinglu Sun, Shanghai (CN); Jian Zhou, Shanghai (CN)

(73) Assignee: SHANGHAI MICRO ELECTRONICS EQUIPMENT (GROUP) CO., LTD., Shanghai (CN)

( * ) Notice: Subject to any disclaimer, the term of this patent is extended or adjusted under 35 U.S.C. 154(b) by 0 days.

(21) Appl. No.: 15/576,606

(22) PCT Filed: May 19, 2016

(86) PCT No.: PCT/CN2016/082583
§ 371 (c)(1),
(2) Date: Nov. 22, 2017

(87) PCT Pub. No.: WO2016/188358
PCT Pub. Date: Dec. 1, 2016

(65) Prior Publication Data
US 2018/0157177 A1     Jun. 7, 2018

(30) Foreign Application Priority Data

May 24, 2015   (CN) .......................... 2015 1 0268841

(51) Int. Cl.
*G03F 7/20* (2006.01)
*G02B 7/00* (2006.01)

(52) U.S. Cl.
CPC ......... *G03F 7/70475* (2013.01); *G02B 7/005* (2013.01); *G03F 7/20* (2013.01);
(Continued)

(58) Field of Classification Search
CPC ......... G02B 7/005; G03F 7/20; G03F 7/2004; G03F 7/2045; G03F 7/70275; G03F 7/70308; G03F 7/70475; G03F 7/70716
(Continued)

(56) References Cited

U.S. PATENT DOCUMENTS

2001/0052966 A1\* 12/2001 Fujitsuka ............ G03F 7/70066
355/53
2011/0069295 A1   3/2011 Kraehmer et al.

FOREIGN PATENT DOCUMENTS

CN         1452017 A    10/2003
CN       101052922 A    10/2007
(Continued)

*Primary Examiner* — Colin Kreutzer
(74) *Attorney, Agent, or Firm* — Muncy, Geissler, Olds & Lowe, P.C.

(57) ABSTRACT

An exposure device is disclosed, including: a light source (1), an illumination module (2), a mask stage (5), a projection objective module, an imaging position adjustment module (4) and a wafer stage (6), disposed sequentially along a direction of light propagation, the imaging position adjustment module (4) including a plurality of adjustment elements (410) arranged individually, the projection objective module including a plurality of projection objectives (3) each having an FoV in positional correspondence with a respective one of the plurality of adjustment elements (410). The imaging position adjustment module (4) ensures satisfactory imaging quality and FoV stitching quality of the projection objectives (3) by performing translation, magnification, focal plane and other adjustments on an image formed by the projection objective module. The projection objective module is simpler as it does not contain any component or mechanism for imaging position adjustment.

17 Claims, 6 Drawing Sheets

(52) U.S. Cl.
CPC .......... *G03F 7/2004* (2013.01); *G03F 7/2045* (2013.01); *G03F 7/70258* (2013.01); *G03F 7/70275* (2013.01); *G03F 7/70308* (2013.01); G03F 7/70716 (2013.01)

(58) Field of Classification Search
USPC .................................................. 355/55, 67
See application file for complete search history.

(56) References Cited

FOREIGN PATENT DOCUMENTS

| | | |
|---|---|---|
| CN | 101118387 A | 2/2008 |
| CN | 1011425534 A | 3/2008 |
| CN | 103364963 A | 10/2013 |
| CN | 203444239 U | 2/2014 |
| CN | 105549327 A | 5/2016 |
| JP | 2010039347 A | 2/2010 |
| WO | WO 2013/029879 A1 | 3/2013 |

\* cited by examiner

EXPOSURE DEVICE

TECHNICAL FIELD

The present invention relates to the fabrication of integrated circuits (ICs) and, in particular, to an exposure apparatus.

BACKGROUND

Flat panel display technology is developing rapidly with such devices continuously increasing in size. Exposure using an objective with a large field of view (FoV) can result in an effective increase in yield. However, FoV enlargement for an objective optical system will raise difficulties in design, manufacturing and other aspects. A required large FoV can be alternatively achieved by stitching equally-sized FoVs of several sub-objectives that are arranged in a certain manner. The number of the used sub-objectives is determined by the size of the required FoV. This approach can meet the needs for large FoV, while reducing the optical processing and manufacturing difficulties and providing high compatibility and flexibility.

Due to the stitching of multiple sub-objectives, and because of performance and assembly tolerances of each sub-objective and other factors, imaging positions of the individual sub-objectives may deviate from their theoretical positions. In addition, the large-sized mask may undergo gravity-caused deformations which may lead to deviations in surface profile of the photosensitive substrate. In order to make each imaging FoV be located at its ideal position, each of the sub-objectives is provided with a separate adjustment mechanism for adjusting the position of its imaging FoV to ensure the performance of the whole stitching FoV.

A scanning exposure apparatus equipped with multiple projection optical systems that generate neighboring projection fields stepping forward by predetermined amounts of displacement in the scanning direction, with end portions of neighboring projection fields overlapping each other in a direction orthogonal to the scanning direction, is called a scanning exposure apparatus with multiple lenses (multi-lens scanning exposure apparatus). With such a multi-lens scanning exposure apparatus, the mask is illuminated through multiple slit-shaped illumination regions and is scanned together with the photosensitive substrate simultaneously in a direction orthogonal to the arrangement direction of the illumination regions so that the multiple projection optical systems corresponding to the respective illumination regions expose a pattern on the mask onto the photosensitive substrate.

In an exposure apparatus disclosed in the prior art, focal plane adjustment is accomplished by translating right-angle reflectors disposed in an optical path or a group of wedge plates arranged on the object side, and horizontal shifts of the image are enabled by rotating two parallel plates on the object side respectively about the X- and Y-directions. Additionally, magnification adjustment is made possible by moving any one of three half-lenses on the image side that constitute an afocal optical system, but however, at the same time, introduces a change in the focal plane which has to be offset using the focal adjustment system. In another exposure apparatus, magnification adjustment is accomplished by axial translation of an afocal system consisting of two lenses placed in a catadioptric optical path, and focal plane adjustment is made possible by translation of an afocal system consisting of three lenses disposed on the image side.

As discussed above, in order to ensure good quality of the FoV of stitching objectives, each of the conventional exposure systems employs adjustment mechanisms in the stitching objectives for enabling positional adjustment of the image plane, which increase structural complexity of the objectives and tightness of their internal spaces. In addition, these adjustment mechanisms are driven by respective motor-based actuation systems which require regular repairs and maintenance. Placement of them in the objectives makes them less accessible for such repairs and maintenance operations.

SUMMARY OF THE INVENTION

The present invention solves the problem of spatial dependence of the adjustment mechanisms on the objectives by presenting an exposure apparatus.

To this end, the presented exposure apparatus includes: a light source, an illumination module, a mask stage, a projection objective module, an imaging position adjustment module and a wafer stage, disposed sequentially along a direction of light propagation, the imaging position adjustment module includes a plurality of adjustment elements arranged individually, the projection objective module includes a plurality of projection objectives each having an imaging field of view in positional correspondence with a respective one of the plurality of adjustment elements.

Preferably, each of the plurality of adjustment elements may include an optical system, a motor-based actuation system and a control system, the control system is configured to adjust the optical system by the motor-based actuation system so as to change the imaging field of view of a corresponding one of the plurality of projection objectives.

Preferably, the optical system may have parallel light-incident and light-exit surfaces, wherein each of the plurality of adjustment elements is arranged within a back working distance of a corresponding one of the plurality of projection objectives.

Preferably, the optical system of each of the plurality of adjustment elements may have an optical axis in coincidence with an optical axis of a corresponding one of the plurality of projection objectives and a clear aperture greater than the imaging field of view of the corresponding one of the plurality of projection objectives.

Preferably, the optical system may include: a first lens, having a first planar surface and a first curved surface; a second lens, having a second curved surface facing toward the first curved surface and a third curved surface; a third lens, having a fourth curved surface facing toward the third curved surface and a first bevel; and a fourth lens, having a second bevel and a second planar surface, wherein the second bevel is arranged close and parallel to the first bevel, and wherein the second planar surface is parallel to the first planar surface.

Preferably, the optical system may be configured to adjust at least one of a focal plane, magnification and translation of a corresponding one of the plurality of projection objectives by adjusting relative positions of at least one pair of adjacent ones of the lenses.

Preferably, the optical system may include the first, second, third and fourth lenses or the fourth, third, second and first lenses disposed sequentially along the direction of light propagation.

Preferably, the first lens may be a plano-convex lens or a plano-concave lens.

Preferably, the third lens may be a plano-convex lens or a plano-concave lens.

Preferably, the second lens may be a biconvex lens, a biconcave lens or a meniscus lens.

Preferably, each of the first, second, third and fourth lenses may be a complete circular lens or part of a complete circular lens.

Preferably, the first curved surface may have a radius of curvature equal to a radius of curvature of the second curved surface, wherein the third curved surface has a radius of curvature equal to a radius of curvature of the fourth curved surface.

Preferably, the first curved surface may have a radius of curvature equal to a radius of curvature of the fourth curved surface.

Preferably, each of the first, second, third and fourth curved surfaces may have a radius of curvature ranging from 200 mm to 2000 mm.

Preferably, each of the first and second bevels may have a wedge angle of from 0.5° to 10°.

Preferably, the optical system may include at least one parallel plate, at least one wedge plate and at least one afocal air-spaced doublet.

Preferably, the optical system may include a cooling system.

Preferably, the plurality of adjustment elements may be mechanically interconnected into a unitary body.

Preferably, the plurality of adjustment elements may be interconnected into a unitary body by using an integral frame.

Compared with the prior art, the present invention has the following advantages:

1) The imaging position adjustment module is separate from and spatially independent of the projection objective module.

2) The imaging position adjustment module facilitates system assembly and reduces the complexity of the projection objectives. In addition, repairs and maintenance of the independent imaging position adjustment module is easier.

3) The imaging position adjustment module is capable of translation, magnification, focal plane and other adjustments in an image formed by the projection objective module and ensures good quality of the stitching FoV of the projection objectives. The projection objective module is responsible for only projection imaging and does not contain any component or mechanism for imaging position adjustment, and stitching FoV is accomplished in a mechanical way. This reduces the complexity of the projection objectives.

DETAILED DESCRIPTION

Specific embodiments of the present invention will be described below in greater detail with reference to the accompanying drawings so that the above objects, features and advantages of the invention will be more apparent. It is noted that the drawings are provided in a very simplified form not necessarily presented to scale, with the only purpose of facilitating convenience and clarity in explaining the embodiments.

Figure 1:
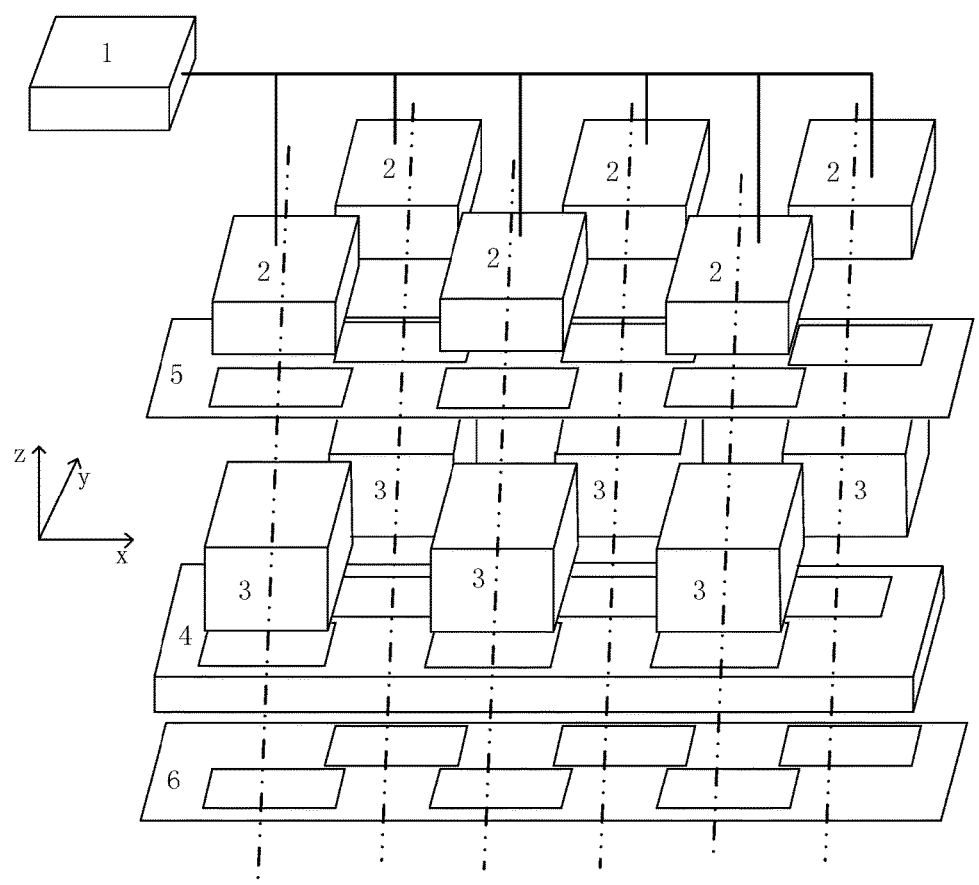
FIG. 1 is a structural schematic of the exposure apparatus of the present invention.

As shown in FIG. 1, an exposure apparatus according to the present invention includes, disposed sequentially along the direction of light propagation, a light source 1, an illumination module 2, a mask stage 5, a projection objective module, an imaging position adjustment module 4 and a wafer stage 6.

Figure 2:
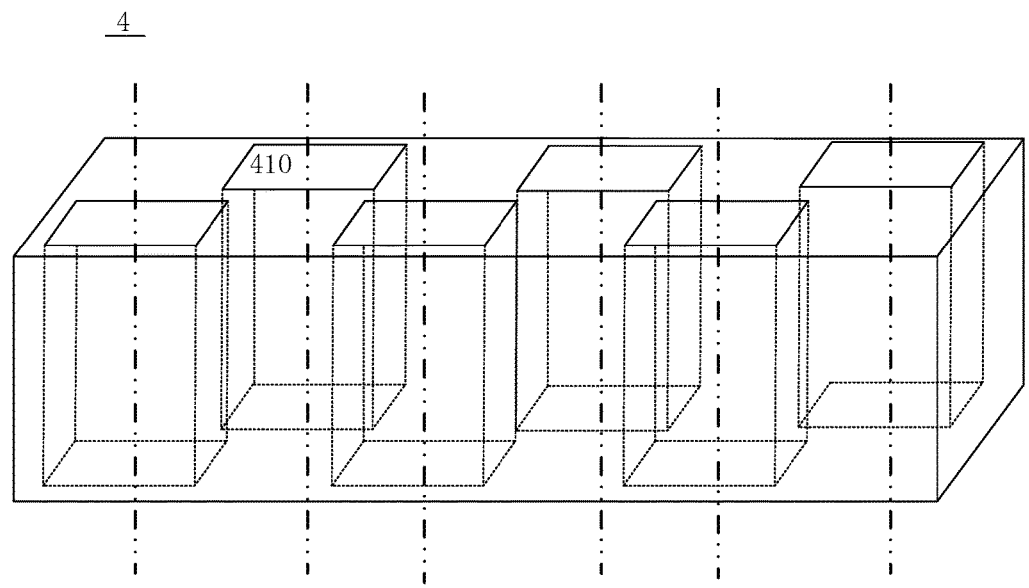
FIG. 2 is a structural schematic of an imaging position adjustment module in the exposure apparatus of the present invention.
Figure 3:
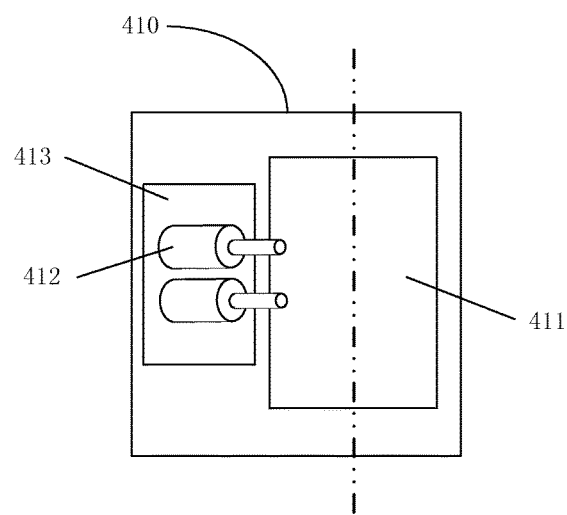
FIG. 3 is a structural schematic of an adjustment element in the exposure apparatus of the present invention.

The projection objective module is composed of multiple identical projection objectives 3 arranged in a first direction (X-direction) and a second direction (Y-direction) such that their field-of-views (FoVs) are stitched into a large and continuous FoV. As shown in FIGS. 2 and 3, the imaging position adjustment module 4 includes multiple independent identical adjustment elements 410, i.e., the imaging position adjustment module 4 is composed of multiple independent identical adjustment elements 410 stitched in a manner which is the same as that of the projection objectives 3 so that each of the adjustment elements 410 corresponds in position to a respective one of the FoVs of the projection objectives 3.

Ultraviolet (UV) light emanated from the light source 1 is split, homogenized and otherwise processed by the illumination module 2 and thereby forms multiple illumination beams irradiated onto selected areas of a mask (which is positioned on the mask stage 5), and the projection objectives 3 and the imaging position adjustment module 4 then image patterns in the specific areas of the mask with a certain magnification onto corresponding areas of a substrate (which is placed on the wafer stage 6). A complete continuous image can be formed on the substrate by moving the mask stage 5 and the wafer stage 6 relative to the projection objective 3 and the adjustment elements 410 in the scanning direction (the Y-direction).

Preferably, with emphasized reference to FIG. 3, each adjustment element 410 includes an optical system 411, as well as a motor-based actuation system 412 and a control system 413 corresponding to the optical system 411. Each of the adjustment elements 410 is capable of individually adjusting the focal plane, magnification and translation for the FoV of the corresponding one of the projection objective 3.

Specifically, the motor-based actuation system 412 drives components in the optical system 411 under the control of the control system 413 so that the position of the image formed thereby can be modified. The optical system 411 in the adjustment element 410 is designed as an afocal system, i.e., a system having parallel light-incident and light-exit surfaces. For this consideration, the adjustment element 410 is arranged in a back working distance of the projection objective 3 so that it modifies only the imaging position and chromatic aberration while not affecting its other imaging quality parameters. Modifiable amounts of the focal plane and chromatic aberration can be taken into account in the design of the projection objective 3 so that they can be compensated for and matched. As a result, their impact on the imaging performance of the projection objective 3 is negligible. Further, the optical system 411 has an optical axis in coincidence with an optical axis of the projection objective 3 corresponding to the adjustment elements 410. Furthermore, the optical system 411 has a clear aperture greater than the imaging FoV of the projection objective 3 so that, with similarity to the FoVs of the projection objectives 3, the FoVs of the adjustment elements 410 are stitched such that, with respect to a direction along which they are stitched (the X-direction), the distance between centers (optical axes) of two adjacent adjustment elements 410 is less than an effective length at which their FoVs adjoin each other. Preferably, the complexity of the exposure apparatus is further reduced due to relatively loose requirements of the afocal system on its assembled position.

Preferably, the multiple adjustment elements 410 may be mechanically assembled together, for example, integrally using a frame, in order to increase stability of the exposure apparatus. Alternatively, the adjustment elements 410 may also be connected together into one structure by a specific connecting method.

Further, the imaging position adjustment module 4 may employ a single common independent control unit (not shown) which coordinates the individual control systems 413 in the respective adjustment elements 410. In this case, the motor-based actuation system 412 in each adjustment element 410 effects component actuation based on instructions modified by and received from the independent control unit. The imaging position adjustment module 4 may be provided with a single cooling system or individual cooling systems for the respective adjustment elements 410, in order to reduce the impact of heat generated by the motor-based actuation systems 412 on the environment where the projection objectives 3 are in.

As the projection objective module of the present invention does not contain any imaging adjustment mechanisms inside it, the imaging position adjustment module 4 can be disposed spatially independent of the projection objectives 3. This allows repairs and maintenance of imaging position adjustment component or the motor-based actuation systems of the exposure apparatus to be performed by only handling the imaging position adjustment module 4 without affecting the projection objectives 3. In addition, as the requirements of the afocal system on the assembly accuracy are not strict, direct replacement of one or more of the adjustment elements 410 is possible, which make the repairs and maintenance of the exposure system easier.

As each projection objective 3 does not have any adjustment mechanism, it is not necessary to take account in spaces for repairs and maintenance of motors in design of the projection objectives 3, making the mechanical design of the projection objectives 3 easier. Additionally, an integral hermetic design may be adopted to ensure higher stability and reliability of the projection objectives 3.

In an exposure process carried out by the exposure apparatus of the present invention, concurrently with the synchronized movement of the mask stage 5 and the wafer stage 6 along the scanning direction (the Y-direction), the projection objective module directs light from the illumination module 2 onto pattern areas of the mask, so that the patterns in the areas are imaged with the same magnification onto the substrate. At the same time, the imaging position adjustment module 4 receives from the independent control unit instructions for correcting errors including differences between imaging positions of the objectives, machining tolerances of the mask and substrate, gravitational deformation-caused imaging FoV defocus and variations in translation and magnification, based on which, the individual adjustment elements 410 follows their own imaging FoV adjustment curves to perform real-time adjustments to ensure accurate and consistent imaging positions which enable a good exposed pattern on the substrate.

Embodiment 1

Figure 4:
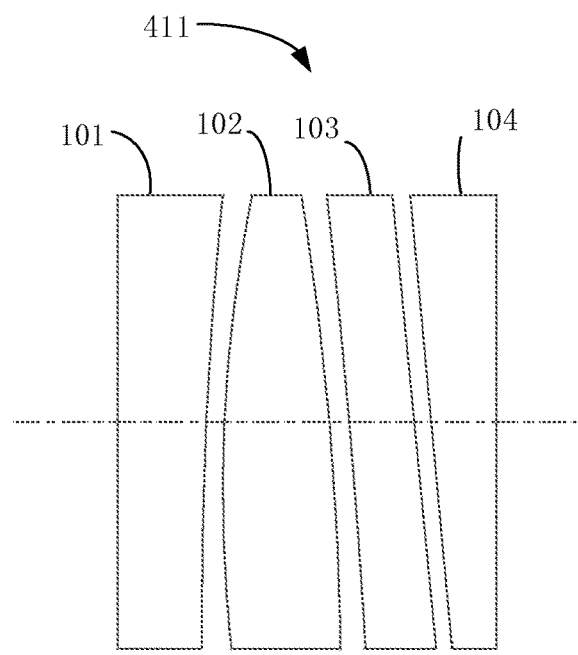
FIGS. 4 and 5 are structural schematics of an adjustment element according to a first embodiment of the present invention.
Figure 5:
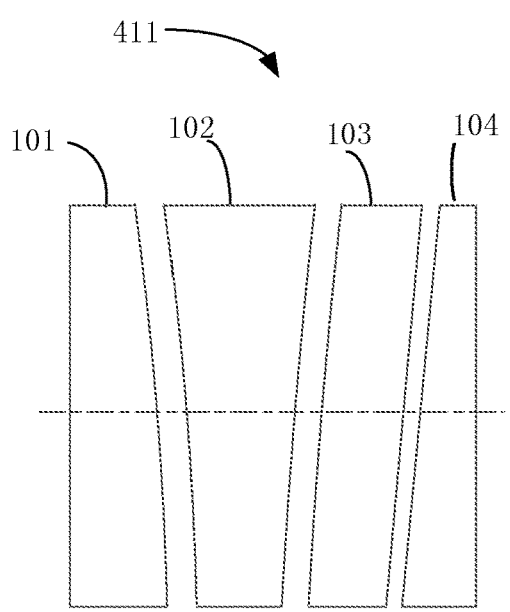

As shown in FIGS. 4 and 5, in this embodiment, each optical system 411 is an afocal system having parallel surfaces (i.e., light-incident and light-exit surfaces) on its opposing sides. Specifically, each optical system includes: a first lens 101 having a planar side and a spherical side; a second lens 102 having two spherical sides; a third lens 103 having a spherical side and a planar wedge side; and a fourth lens 104 which is a wedge plate.

The optical system 411 is configured in such a manner that the light propagates sequentially through the first, second, third and fourth lenses 101, 102, 103, 104, or sequentially through the fourth, third, second and first lenses 104, 103, 102, 101, and is not limited to the curvatures of the surface as shown in FIG. 4 or 5. Further, the optical system 411 may be disposed in the way as shown in FIG. 4, or inverted with respect to the configuration of FIG. 4.

Preferably, each of the first and third lenses 101, 103 is selected as a plano-convex or plano-concave lens. The second lens 102 may be implemented as a biconvex, biconcave or meniscus lens. Each of the first, second, third and fourth lenses 101, 102, 103, 104 may either be a complete circular lens or part of a complete circular lens.

Preferably, the spherical surface of the first lens 101 has a radius of curvature that is equal or close to a radius of curvature of the spherical surface of the second lens 102 facing toward the first lens 101. The other spherical surface of the second lens 102 has a radius of curvature that is equal or close to a radius of curvature of the spherical surface of the third lens 103. The radius of curvature of the spherical surface of the first lens 101 is equal, or not, to the radius of curvature of the spherical surface of the third lens 103.

Figure 6:
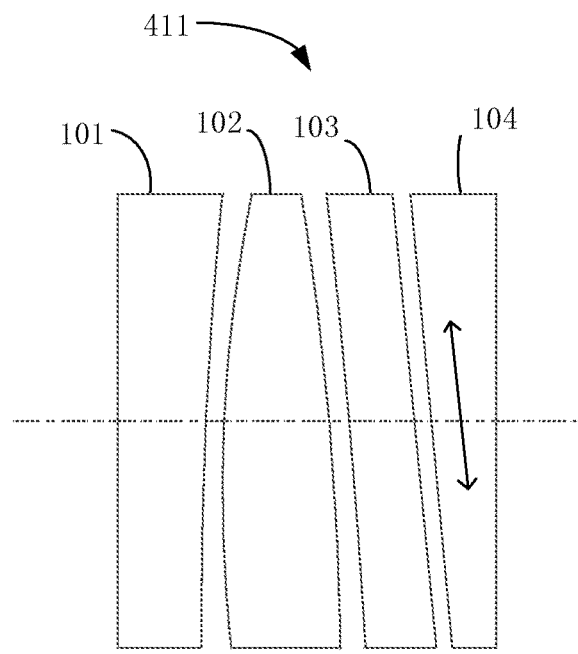
FIG. 6 schematically illustrates a method for focal plane adjustment according to the first embodiment of the present invention.
Figure 7:
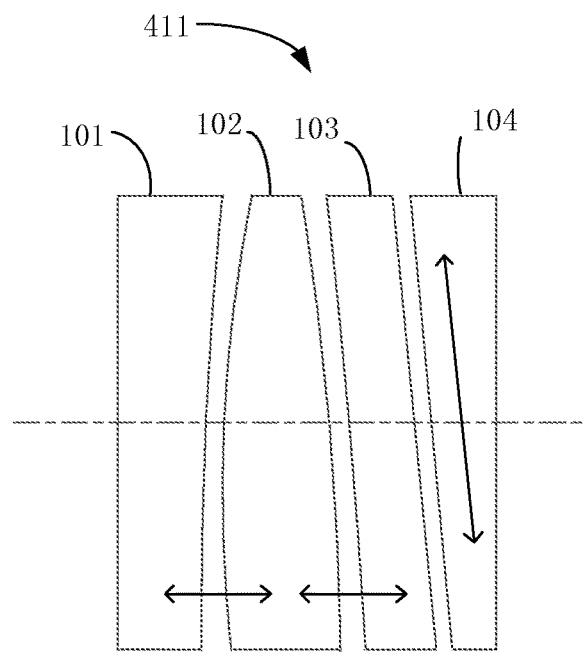
FIG. 7 schematically illustrates a method for magnification adjustment according to the first embodiment of the present invention.

As shown in FIGS. 6 and 7, when the fourth lens 104 is moved along the direction parallel to its wedge surface, its thickness within the optical path will be increased or reduced, resulting in a change in the length that light travels in the adjustment element 410 and hence a change in its focal plane. Here, the fourth lens 104 is moved with an air gap between the third and fourth lenses 103, 104 remaining the same so as to avoid any horizontal translation of the image caused by the focal plane adjustment.

The sensitivity of the focal plane adjustment is proportional to the wedge angle of the wedge surfaces of the third and fourth lenses 103, 104 and proportional to the refractive index of the material of the fourth lens 104. Desired adjustment sensitivity can be achieved by properly selecting the material and the wedge angle according to the requirements of the system on adjustment range and accuracy.

As shown in FIG. 7, magnification of the optical system may be changed by altering both or either of an air gap between the first and second lenses 101, 102 and an air gap between the second and third lenses 102, 103. Further, any change in the focal plane caused by the variations in the air gaps can be prevented by means of moving the fourth lens 104 along the direction parallel to its wedge surface so as to make magnification adjustment free of any other influence.

The sensitivity of magnification adjustment is related to the altered air gap(s), and the sensitivity of each air gap is related to the materials and radii of curvature of adjacent two lenses (i.e., the first and second lenses 101, 102, or the second and third lenses 102, 103). Therefore, for a finished adjustment element 410, different sensitivities can be obtained by adjusting either or both of the air gaps. According to the present invention, the radii of curvature and materials of the lenses may be so selected that the two air gaps have different sensitivities. As such, different sensitivities can be achieved for various applications by adjusting the more sensitive gap, the less sensitive gap or both of them.

Figure 8:
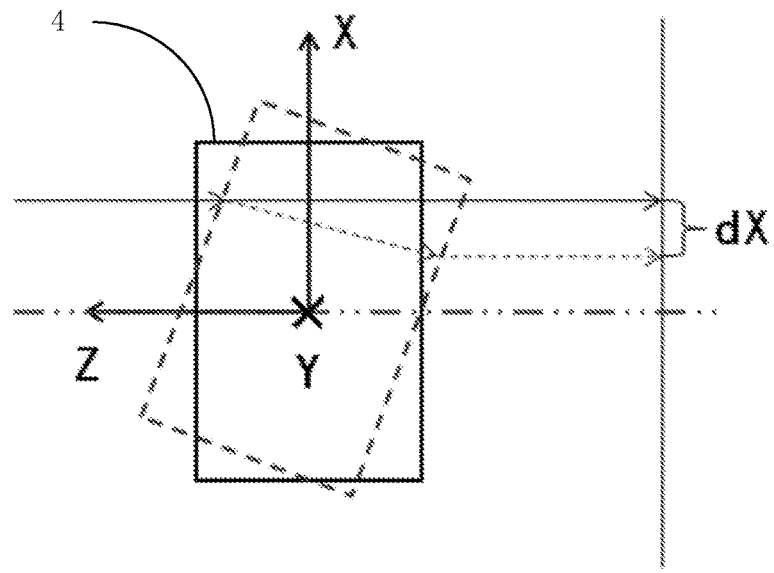
FIGS. 8 and 9 schematically illustrate a method for translation adjustment according to the first embodiment of the present invention.
Figure 9:
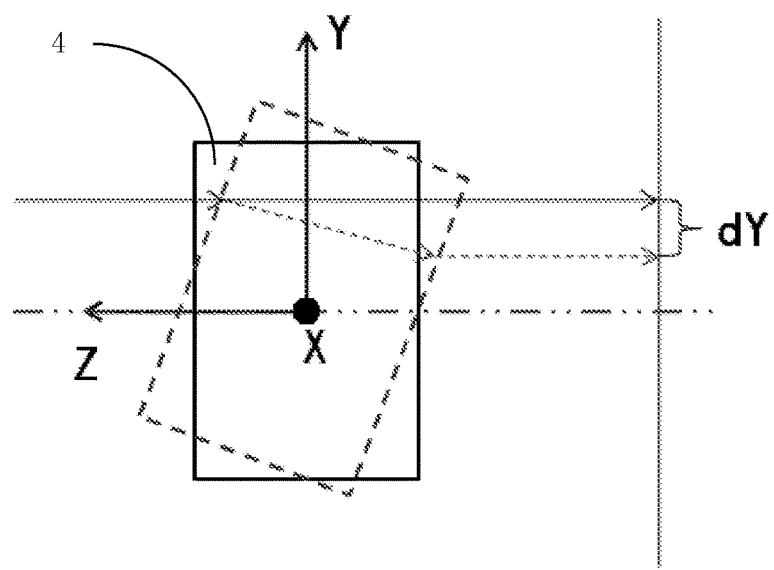

As shown in FIGS. 8 and 9, the imaging position adjustment module 4, as a whole, functions like a parallel plate. It can cause the image plane to translate in the Y-direction when rotating about the X-axis and can lead to translational displacement of the image in the X-direction when rotating about the Y-axis. As shown in FIG. 8, the image plane translates a distance of dX in response to rotation of the imaging position adjustment module 4 about the Y-axis, and translates a distance of dY in response to rotation of the imaging position adjustment module 4 about the X-axis. Sensitivity of translation adjustment is proportional to the overall refractive index of the materials of the four lenses and is proportional to the aggregate thickness of the four lenses. Likewise, various sensitivities can be achieved through properly selecting the materials and thicknesses of the lenses.

Preferably, the four lenses are made of material(s) with high transmittance to UV light. Optimum mechanical, control and other sensitivities may be achieved at radii of curvature of the spherical surfaces of the first, second and third lenses 101, 102, 103 in the range from 200 mm to 2000 mm and a wedge angle of each of the wedge surfaces of the third and fourth lenses 103, 104 in the range from 0.5° to 10°.

Figure 10:
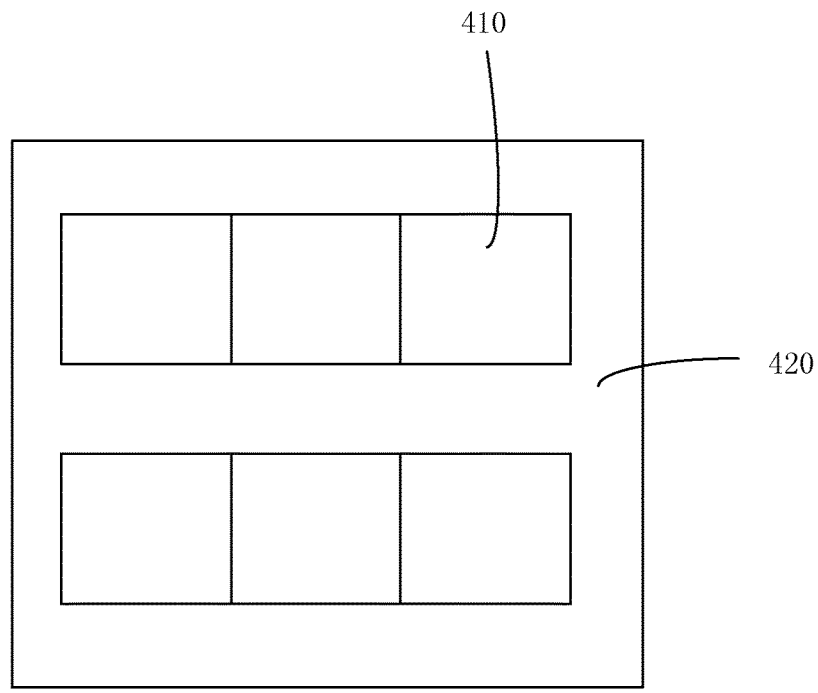
FIG. 10 is a structural schematic of an imaging position adjustment module according to the first embodiment of the present invention.

FIG. 10 shows a possible structure of the imaging position adjustment module 4. The imaging position adjustment module 4 is disposed between the last optical element of the projection objective module and the substrate. Each of the adjustment elements 410 can independently perform adjustments, be maintained and replaced as a whole. Specifically, six adjustment units 410 are integrated on a single supporting frame 420, which has supporting and cooling capabilities. The supporting frame 420 is coupled to the main structure of the exposure apparatus so that the imaging position adjustment module 4 is wholly secured and integrated to the main structure.

Table 1 summarizes detailed data of the lenses in each adjustment element 410. Magnification adjustment is accomplished by axial movement of the second lens 102 driven by a motor, and focal plane adjustment is enabled through moving the fourth lens 104 along the direction of its bevel by virtue of a motor and rails.

TABLE 1

Data of Optical System in Adjustment Element

| Nomenclature | Radius | Thickness | Material | Wedge Angle |
|---|---|---|---|---|
| First Lens | Infinity | 15 | Silica | |
| | 800 | 1.6 | Air | |

TABLE 1-continued

Data of Optical System in Adjustment Element

| Nomenclature | Radius | Thickness | Material | Wedge Angle |
|---|---|---|---|---|
| Second Lens | 800 | 15 | Silica | |
| | −900 | 1.5 | Air | |
| Third Lens | −900 | 15 | Silica | |
| | Infinite | 0.5 | Air | 5° |
| Fourth Lens | Infinite | 10 | Silica | 5° |
| | Infinite | | Air | |

Embodiment 2

Figure 11:
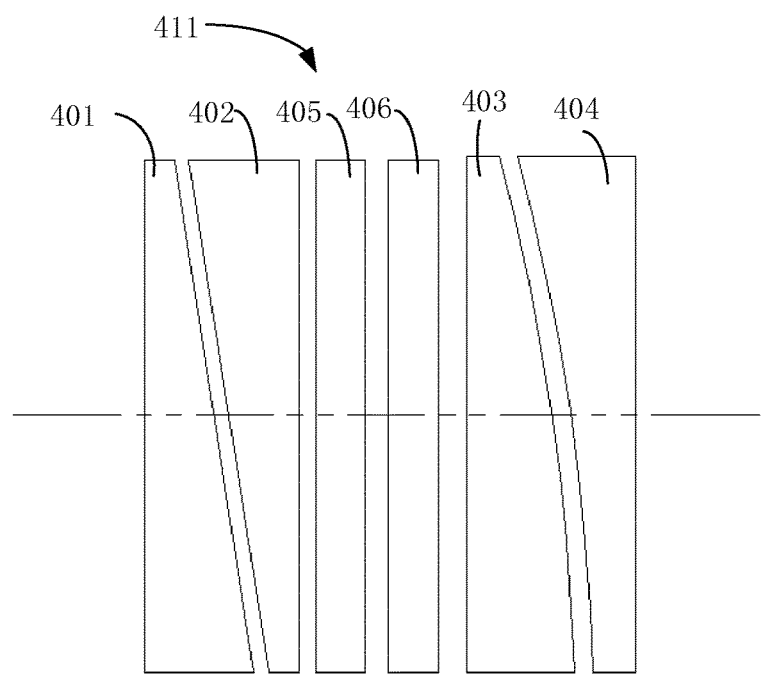
FIG. 11 is a structural schematic of an optical system in an adjustment element according to a second embodiment of the present invention.

In this embodiment, as shown in FIG. 11, in each adjustment element 410, the optical system 411 may be made up of parallel plate(s) 405 and/or 406 for image translation adjustment, two wedge plates 401, 402 for focal plane adjustment and an afocal air-spaced doublet 403, 404 for magnification adjustment, or constructed by inserting two parallel plate between the second and third lenses 102, 103 in Embodiment 1. In either case, the optical system has parallel light-incident and light-exit surfaces. That is, according to the present invention, selection and configuration of lenses in the optical system 411 is possible according to the practical needs and working distance of the projection objectives. Of course, regardless of what forms the constituent components assume, the focal plane, magnification and translation adjustments may be accomplished either simultaneously or separately.

In summary, the exposure apparatus of the present invention additionally includes the imaging position adjustment module 4 which ensures satisfactory imaging quality and stitching quality of the projection objectives 3 through performing translation, magnification, focal plane and other adjustments on an image formed by the projection objective module. The projection objective module is responsible for only projection imaging and does not contain any component or mechanism for imaging position adjustment, and stitching of the FoVs is accomplished in a mechanical way. This reduces the complexity of the projection objective module and makes repairs and maintenance of the independent imaging position adjustment module easier.

It is apparent that those skilled in the art can make various modifications and variations to the present invention without departing from the spirit and scope thereof. Accordingly, it is intended that all such modifications and variations are embraced in the scope of the invention if they fall within the scope of the appended claims and their equivalents.

What is claimed is:

1. An exposure apparatus, comprising: a light source, an illumination module, a mask stage, a projection objective module, an imaging position adjustment module and a wafer stage, disposed sequentially along a direction of light propagation, the imaging position adjustment module comprising a plurality of adjustment elements arranged individually, the projection objective module comprising a plurality of projection objectives each having an imaging field of view in positional correspondence with a respective one of the plurality of adjustment elements, wherein each of the plurality of adjustment elements comprises an optical system, a motor-based actuation system and a control system, the control system configured to adjust the optical system by the motor-based actuation system so as to change the imaging field of view of a corresponding one of the plurality of projection objectives, wherein the optical system comprises:
a first lens, having a first planar surface and a first curved surface;
a second lens, having a second curved surface facing toward the first curved surface and a third curved surface;
a third lens, having a fourth curved surface facing toward the third curved surface and a first bevel; and
a fourth lens, having a second bevel and a second planar surface, wherein the second bevel is arranged close and parallel to the first bevel, and wherein the second planar surface is parallel to the first planar surface.

2. The exposure apparatus of claim 1, wherein the optical system has parallel light-incident and light-exit surfaces, and wherein each of the plurality of adjustment elements is arranged within a back working distance of a corresponding one of the plurality of projection objectives.

3. The exposure apparatus of claim 1, wherein the optical system of each of the plurality of adjustment elements has an optical axis in coincidence with an optical axis of a corresponding one of the plurality of projection objectives and a clear aperture greater than the imaging field of view of the corresponding one of the plurality of projection objectives.

4. The exposure apparatus of claim 1, wherein the optical system is configured to adjust at least one of a focal plane, magnification and translation of a corresponding one of the plurality of projection objectives by adjusting relative positions of at least one pair of adjacent ones of the lenses.

5. The exposure apparatus of claim 1, wherein the optical system comprises the first, second, third and fourth lenses or the fourth, third, second and first lenses disposed sequentially along the direction of light propagation.

6. The exposure apparatus of claim 1, wherein the first lens is a plano-convex lens or a plano-concave lens.

7. The exposure apparatus of claim 1, wherein the third lens is a plano-convex lens or a plano-concave lens.

8. The exposure apparatus of claim 1, wherein the second lens is a biconvex lens, a biconcave lens or a meniscus lens.

9. The exposure apparatus of claim 1, wherein each of the first, second, third and fourth lenses is a complete circular lens or part of a complete circular lens.

10. The exposure apparatus of claim 1, wherein the first curved surface has a radius of curvature equal to a radius of curvature of the second curved surface, and wherein the third curved surface has a radius of curvature equal to a radius of curvature of the fourth curved surface.

11. The exposure apparatus of claim 1, wherein the first curved surface has a radius of curvature equal to a radius of curvature of the fourth curved surface.

12. The exposure apparatus of claim 1, wherein each of the first, second, third and fourth curved surfaces has a radius of curvature ranging from 200 mm to 2000 mm.

13. The exposure apparatus of claim 1, wherein each of the first and second bevels has a wedge angle of from 0.5° to 10°.

14. The exposure apparatus of claim 1, wherein the optical system comprises at least one parallel plate, at least one wedge plate and at least one afocal air-spaced doublet.

15. The exposure apparatus of claim 1, wherein the optical system comprises a cooling system.

16. The exposure apparatus of claim 1, wherein the plurality of adjustment elements is mechanically interconnected into a unitary body.

17. The exposure apparatus of claim 1, wherein the plurality of adjustment elements is interconnected into a unitary body by using an integral frame.

* * * * *